(12) United States Patent
Raby et al.

(10) Patent No.: US 7,764,758 B2
(45) Date of Patent: Jul. 27, 2010

(54) APPARATUS AND/OR METHOD FOR VARIABLE DATA RATE CONVERSION

(75) Inventors: Dean L. Raby, San Diego, CA (US); Robert Caulfield, Rancho Santa Fe, CA (US)

(73) Assignee: LSI Corporation, Milpitas, CA (US)

( * ) Notice: Subject to any disclaimer, the term of this patent is extended or adjusted under 35 U.S.C. 154(b) by 1029 days.

(21) Appl. No.: 10/354,456

(22) Filed: Jan. 30, 2003

(65) Prior Publication Data

US 2004/0151267 A1 Aug. 5, 2004

(51) Int. Cl.
*H04L 7/00* (2006.01)
(52) U.S. Cl. .................................................. 375/355
(58) Field of Classification Search ............... 375/354, 375/355, 344, 376; 327/141; 709/248; 714/12
See application file for complete search history.

(56) References Cited

U.S. PATENT DOCUMENTS

| | | | | |
|---|---|---|---|---|
| 3,681,756 A * | 8/1972 | Burkhard et al. ............ 704/205 |
| 4,748,578 A * | 5/1988 | Lagadec et al. ............. 708/313 |
| 4,851,909 A * | 7/1989 | Noske et al. ................ 348/512 |
| 4,870,661 A * | 9/1989 | Yamada et al. ............. 375/240 |
| 5,126,737 A * | 6/1992 | Torii ........................... 341/61 |
| 5,175,769 A * | 12/1992 | Hejna et al. ................. 704/211 |
| 5,225,787 A * | 7/1993 | Therssen .................... 327/113 |
| 5,228,138 A * | 7/1993 | Pratt et al. .................. 713/401 |
| 5,398,029 A * | 3/1995 | Toyama et al. ............. 341/61 |
| 5,432,511 A * | 7/1995 | Sadjadian et al. .......... 341/61 |
| 5,481,267 A * | 1/1996 | Miyabe et al. ............. 341/61 |
| 5,497,152 A * | 3/1996 | Wilson et al. .............. 341/61 |
| 5,513,209 A * | 4/1996 | Holm ......................... 375/354 |
| 5,559,513 A * | 9/1996 | Rothermel et al. ......... 341/61 |
| 5,617,088 A * | 4/1997 | Yasuda ...................... 341/61 |
| 5,748,120 A * | 5/1998 | Yasuda ...................... 341/61 |
| 5,748,397 A * | 5/1998 | Yamada ..................... 360/32 |
| 5,764,113 A * | 6/1998 | Snell .......................... 332/103 |
| 5,786,778 A * | 7/1998 | Adams et al. ............. 341/61 |
| 5,835,032 A * | 11/1998 | Yasuda ...................... 341/61 |
| 5,920,842 A * | 7/1999 | Cooper et al. ............. 704/503 |
| 5,925,093 A * | 7/1999 | Yasuda ...................... 708/313 |
| 5,982,208 A * | 11/1999 | Kokubo et al. ............. 327/119 |
| 5,996,044 A * | 11/1999 | Yasuda ...................... 711/110 |
| 6,014,682 A * | 1/2000 | Stephen et al. ............. 708/313 |
| 6,067,319 A * | 5/2000 | Copeland ................... 375/232 |
| 6,098,046 A * | 8/2000 | Cooper et al. ............. 704/503 |
| 6,137,349 A * | 10/2000 | Menkhoff et al. ......... 327/552 |
| 6,147,632 A * | 11/2000 | Iwasaki ...................... 341/123 |
| 6,154,497 A * | 11/2000 | Gatherer et al. ........... 375/247 |
| 6,208,671 B1 * | 3/2001 | Paulos et al. ............... 370/545 |
| 6,249,235 B1 * | 6/2001 | Iwasaki ...................... 341/123 |
| 6,421,636 B1 * | 7/2002 | Cooper et al. ............. 704/205 |
| 6,462,682 B2 * | 10/2002 | Hellberg ..................... 341/61 |
| 6,563,448 B1 * | 5/2003 | Fontaine .................... 341/143 |

(Continued)

*Primary Examiner*—Temesghen Ghebretinsae
(74) *Attorney, Agent, or Firm*—Christopher P. Maiorana, PC

(57) ABSTRACT

An apparatus generally comprising a first circuit, a second circuit and a third circuit is shown. The first circuit may be configured to generate a phase signal by dividing each cycle of an output clock into a plurality of phase values. The second circuit may be configured to generate an intermediate data signal by interpolating an input data signal sampled with an input clock in response to the phase signal and the output clock. The third circuit configured to generate an output data signal by sampling the intermediate data signal with the output clock.

18 Claims, 9 Drawing Sheets

U.S. PATENT DOCUMENTS

| | | | |
|---|---|---|---|
| 6,573,940 B1 * | 6/2003 | Yang | 348/441 |
| 6,590,948 B1 * | 7/2003 | Genrich | 375/355 |
| 6,665,338 B1 * | 12/2003 | Midya et al. | 375/238 |
| 6,778,600 B1 * | 8/2004 | Karanovic | 375/232 |
| 6,778,621 B1 * | 8/2004 | Wilson et al. | 375/371 |
| 6,973,431 B2 * | 12/2005 | Cooper et al. | 704/503 |
| 2001/0033188 A1 * | 10/2001 | Aung et al. | 327/141 |
| 2001/0037351 A1 * | 11/2001 | Hellberg | 708/313 |
| 2002/0110213 A1 * | 8/2002 | May et al. | 375/372 |
| 2003/0117925 A1 * | 6/2003 | Tonami | 369/59.22 |
| 2004/0151267 A1 * | 8/2004 | Raby et al. | 375/355 |
| 2005/0130656 A1 * | 6/2005 | Chen | 455/436 |

* cited by examiner

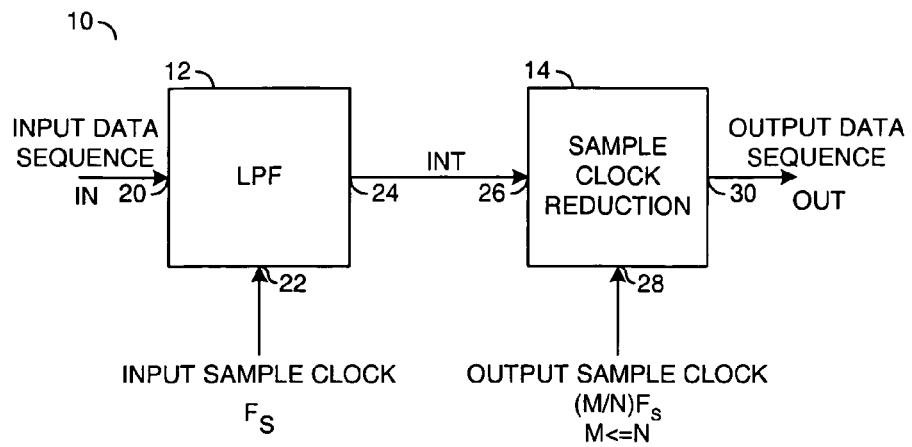
FIG. 1
(CONVENTIONAL)

APPARATUS AND/OR METHOD FOR VARIABLE DATA RATE CONVERSION

FIELD OF THE INVENTION

The present invention relates to digital signal transmission generally and, more particularly, to a method and/or apparatus for implementing variable data rate conversion.

BACKGROUND OF THE INVENTION

Conventional digital signal processing applications commonly increase or decrease a sample rate of an input signal. Functionally, to decrease the sample rate, a data sequence is applied to an anti-aliasing Low Pass Filter (LPF) and a sample rate reduction module.

In a conventional sample rate reduction process, the ratio of an output clock frequency to an input clock frequency is fixed or limited to a set of fractions. As the frequency of the input clock changes, the ratio between the frequency of the input clock and the frequency of the output clock also changes, degrading the signal quality in a typical fixed or multi-rate down-sampling process. Adaptive data rate conversion (ADRC) is a conventional design that allows the input clock rate (or frequency) to change relative to the output clock rate (or frequency), while maintaining signal quality at the output of the conversion process. Such a conventional design adapts to a change in the input sample clock and computes samples at the fixed output clock rate.

The purpose of adaptive data rate conversion is to accurately interpolate a signal at a new output clock rate as the period of the input clock changes in relationship to the period of the output clock. Adaptive data rate conversion adapts to a change in the input sample clock by tracking the relationship between the period of the input clock and the period of the output clock. By accurately estimating the output sample period as the input sample period changes, adaptive data rate conversion accurately interpolates the resampled signal at the output clock rate.

The simplest way to translate a digital signal from one clock domain to another is to pass the digitized signal through a digital-to-analog converter (D/A) and then resample the data through an analog-to-digital converter (A/D) at the output clock rate. However, such an approach is costly in terms of both silicon area and power. Such an approach simply changes the sample points on a band-limited waveform, which is the concept behind a simple data rate converter.

To pass a digital signal between two different clock domains, the data rate is changed (or converted) from the old data rate to the new data rate. Such a conversion is typically done by finding a common ratio between the nominal input data rate and the nominal output rate. A filter can be designed that will either (i) interpolate the incoming data if the input data rate is lower than the output data rate, or (ii) decimate the incoming data if the incoming data rate is higher than the output data rate. In either technique, the filter weights N samples of the incoming data to provide a single unique sample of the output data, while maintaining or providing the planned bandwidth.

A digital approach is preferred since it can be implemented in a smaller silicon area and at considerably lower power. However, unlike the analog approach (which is to a large extent ignorant of the input and output frequencies so long as they meet Nyquist limits) the data converter provides only the correct output waveform when the input data rate and output data rate are at predetermined nominal values. Therefore, if the input data rate changes, the frequency of the normalized output waveform is changed with respect to the output data rate.

Data rate conversion is typically based on the ratio of the input data rate and the output data rate. In the case of sampled data system, the frequency of the input data can vary with the sample clock that introduces errors into the conversion process.

Referring to FIG. 1, a block diagram of a circuit 10 is shown illustrating a fixed down sampling process. The circuit 10 includes a low pass filter (LPF) circuit 12 and a sample clock reduction circuit 14. The LPF 102 may be an anti-aliasing low pass filter. In a typical down-sampling process, an input data sequence is applied to the low pass filter 12 and the circuit 14. The circuit 12 has an input 20 that receives an input data sequence signal (IN), an input 22 that receives an input sample clock signal FS and an output 24 that presents a signal INT. The circuit 12 has an input 26 that receives the signal INT, an input 28 that receives an output sample clock signal and an output 30 that presents an output data sequence (e.g., OUT).

Referring to FIG. 2, a diagram is shown illustrating a time response with fixed down sampling. A continuous time waveform 50 is sampled periodically at a number of input sample points 52a-52d by the input and output sample clock. The input sample points 52a-52d are interpolated to calculate output sample points 54a-54b sampled at a longer period. A typical fixed rate down sampling process computes the output samples shown in FIG. 2. The input sampling clock period is represented by arrow 56. The output sampling clock period is represented by arrow 58.

Referring to FIG. 3, a diagram is shown illustrating an example of time response amplitude error with fixed down sampling. In any resampling system, the resampled signal is estimated at a multiple of the estimated output sample period. In a fixed down sampling system, the output sample period is estimated as a fixed ratio of the input sample period. Further, the fixed down sampling process does not track a change in the relationship between the input clock period and the output clock period. If the input sample period decreases, the estimated output clock period also decreases. Similarly, if the input clock period increases, the estimated output clock period also increases. Therefore, in a fixed down-sampling process, the estimated period of the output clock varies in proportion to the input clock period. As the period of the input clock changes, the time at which the resampled signal amplitude is estimated also changes, causing an amplitude error in the estimated resampled signal.

FIG. 3 shows an example of a reduction in the input sample period 56' with no change in the output sample clock period 58. Due to the fixed sample-rate reduction ratio, the estimated output samples 54a and 54b are computed at incorrect times 60a and 60b. As shown, the actual output sampling instants 62a and 62b are computed as a function of the input sample period 56'. Since the input sample period 56' has been reduced as compared with FIG. 1, the estimated output sample period has also been reduced, causing errors 64a and 64b in the estimated amplitude of the signal 50 at the output clock rate. Instead of computing the amplitude of the signal 50 at the output sample points 54a and 54b, the sample points 62a and 62b are calculated at time 60a and 60b, respectively.

It would be desirable to overcome problems associated with conventional data rate converters by measuring the change in the input data rate and adjust the filter coefficients to provide a stable data rate conversion process whatever the input data rate.

SUMMARY OF THE INVENTION

The present invention concerns an apparatus generally comprising a first circuit, a second circuit and a third circuit. The first circuit may be configured to generate a phase signal by dividing each cycle of an output clock into a plurality of phase values. The second circuit may be configured to generate an intermediate data signal by interpolating an input data signal sampled with an input clock in response to the phase signal and the output clock. The third circuit configured to generate an output data signal by sampling the intermediate data signal with the output clock.

The objects, features and advantages of the present invention include providing an apparatus or method for implementing variable data rate conversion that may (i) automatically apply filter coefficients to maintain spectral purity of the digitized waveform as the input data rate changes with respect to the output data rate, and/or (ii) reduce low frequency distortion (e.g., wow) and frequency fluctuations (e.g., flutter) in the output signal after data rate conversion, such as when an audio signal sampled by a phase lock loop (PLL) is presented by a crystal clock operating at one of several industry standard clock rates.

BRIEF DESCRIPTION OF THE DRAWINGS

These and other objects, features and advantages of the present invention will be apparent from the following detailed description and the appended claims and drawings in which:

FIG. 1 is a block diagram illustrating a conventional fixed down sampling process;

DETAILED DESCRIPTION OF THE PREFERRED EMBODIMENTS

The present invention introduces a fixed down-sampling process. An amplitude error may be created by a change in a sample clock rate of an input signal while the sample clock rate of an output signal remains fixed. The present invention may implement an adaptive data rate conversion (ADRC) that computes the proper output sample as the input sample clock rate changes.

Figure 4:
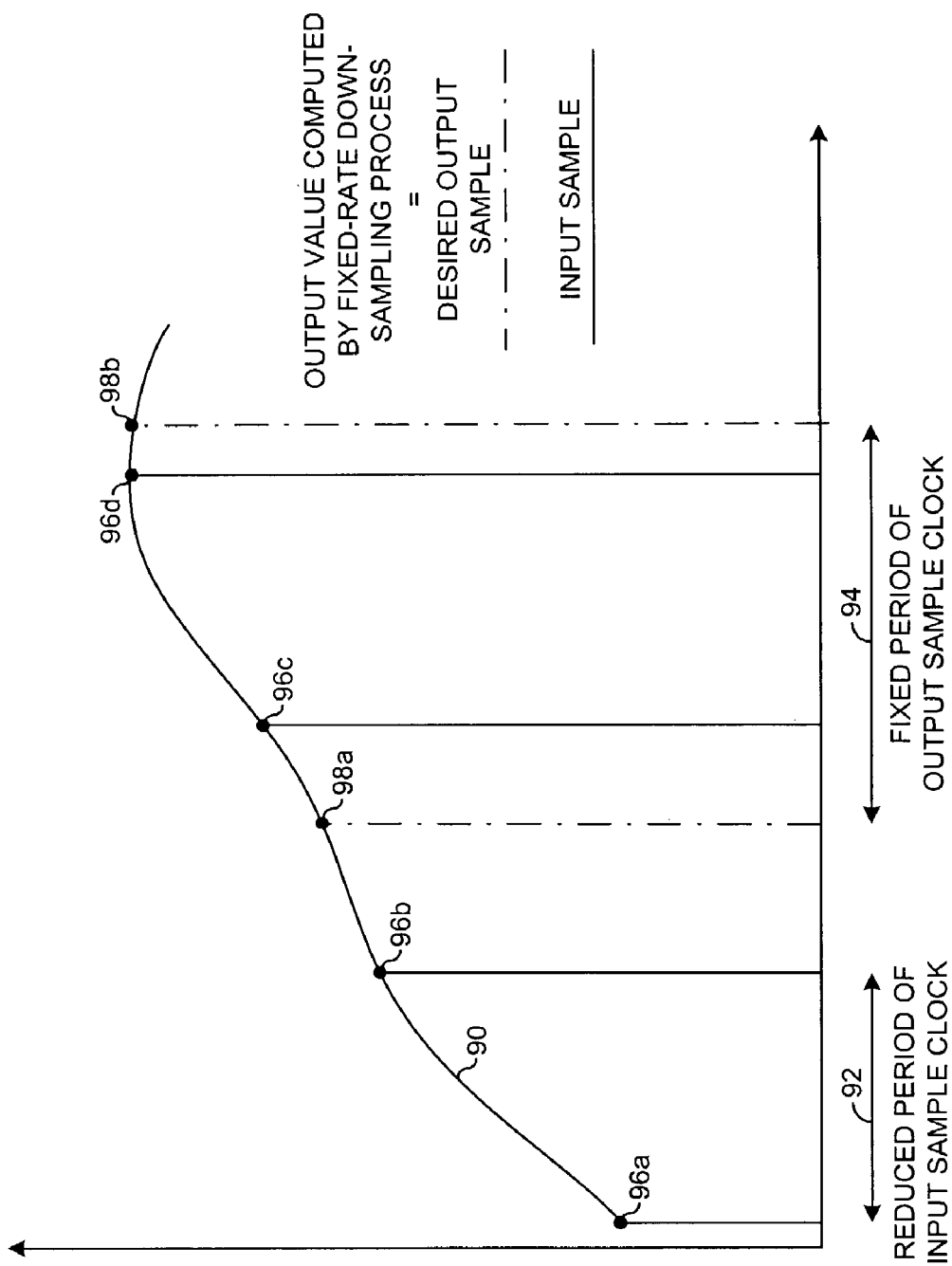
FIG. 4 is a diagram illustrating an input sampling and an output sampling of an example signal.

Referring to FIG. 4, a diagram illustrating an input sampling and an output sampling of an example signal 90 is shown. The present invention may provide a method and/or architecture to accurately interpolate the sampled signal 90, while an input sample period 92 changes in relationship to a fixed output sample period 94. Therefore, the estimated resampled signal may be computed at or proximate the correct time. For example, the signal 90 may be sampled per the input sample clock to generate input sample points 96a-96d. Interpolated output sample points 98a and 98b may then be calculated in alignment with the output sampling clock period 94 regardless of a phase relationship and/or frequency relationship between the input sampling clock period 92 and the output sampling clock period 94.

For a varying input clock and fixed output clock, the estimated output sample period may remain fixed. The process described by the present invention continuously computes the relationship between the variable input clock period 92 and the fixed output clock period 94. By tracking the relationship between the input period 92 and the output period 94, an estimated amplitude of the signal 90 measured at the output clock rate is generally computed at approximately the correct instant of time.

When the down sampling process adapts to the change in the input sample clock period 92, the resampled signal 90 may be computed at the correct time as shown by the example in FIG. 4. Even as the input sample clock period 92 increases, the present invention computes the resampled signal at a multiple of the output clock period 94. The present invention accurately estimates the resampled signal by tracking the relationship between the input and output clock rates and interpolating the samples of the signal.

Figure 5:
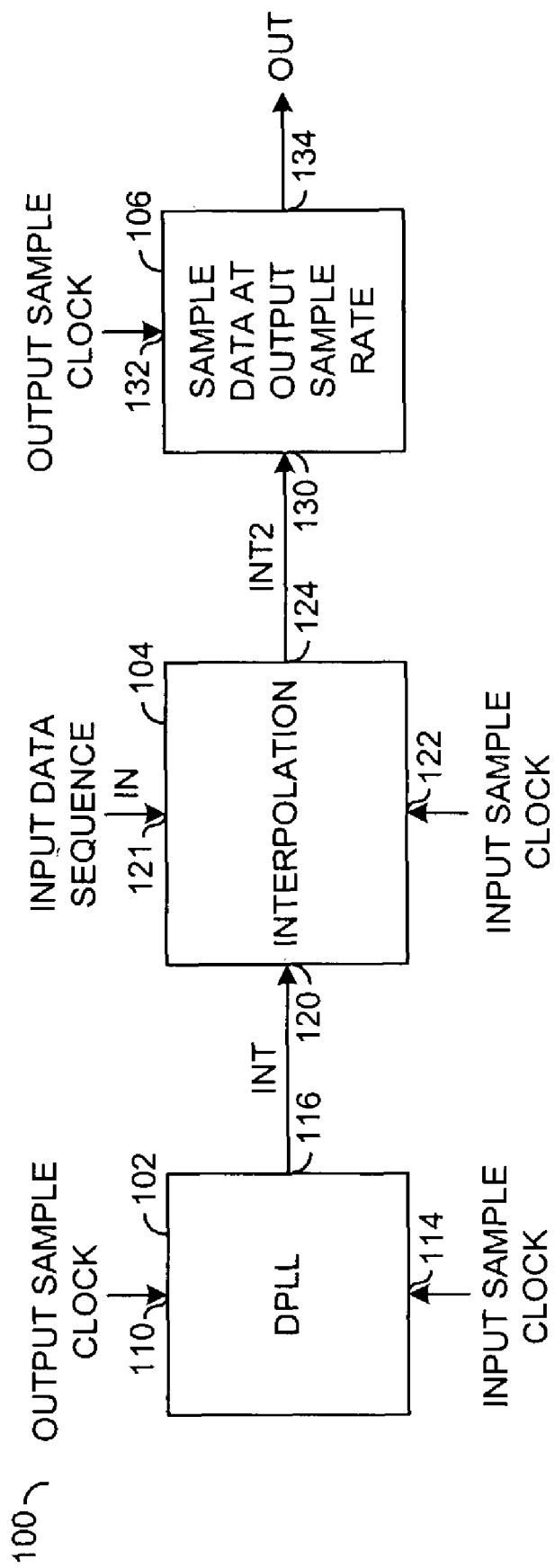
FIG. 5 is a block diagram of an example circuit implementing an adaptive data rate conversion in accordance with a preferred embodiment of the present invention.

Referring to FIG. 5, a block diagram of an example circuit 100 implementing an adaptive data rate conversion in accordance with a preferred embodiment of the present invention is shown. The circuit 100 generally comprises a block (or circuit) 102, a block (or circuit) 104 and a block (or circuit) 106. The circuit 102 may have an input 110 that may receive an output sample clock signal (e.g., OSC), an input 114 that may receive an input sample clock signal (e.g., ISC) and an output 116 that may present an intermediate signal (e.g., INT). The circuit 104 may have an input 120 that may receive the signal INT, an input 121 that may receive an input data sequence signal (e.g., IN), an input 122 that may receive the input sample clock ISC and an output 124 that may present another intermediate signal (e.g., INT2). The circuit 106 may have an input 130 that may receive the signal INT2, an input 132 that may receive the output sample clock signal OSC and an output 134 that may present an output data sequence signal (e.g., OUT).

The circuit 102 may be implemented as a digital phase lock loop (DPLL) circuit. The DPLL circuit 102 generally synchronizes the variable-period input sample clock ISC to the fixed-period output sample clock OSC. The DPLL circuit 102 may compute a phase relationship between the output sample clock OSC and the intermediate signal INT.

From samples of the input sample clock ISC, the output sample clock OSC and the phase relationship, the interpolation circuit 104 generally estimates interpolated output samples at the output sample rate. The interpolated samples may be presented in the second intermediate signal INT2 to the circuit 106. After interpolation, the sample circuit 106 samples the data at the output sample clock OSC rate. The circuit 106 may be implemented as a register or register array to store the samples.

Figure 6:
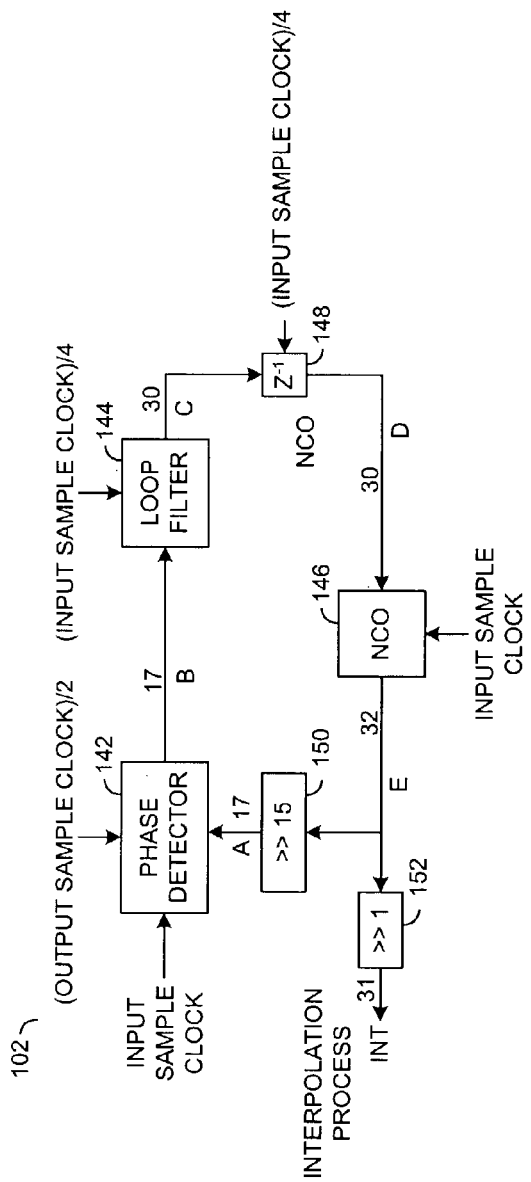
FIG. 6 is a block diagram of an example implementation of a digital phase locked loop circuit.

Referring to FIG. 6, a block diagram of an example implementation of the digital phase locked loop (DPLL) circuit 102 is shown. The DPLL circuit 102 generally comprises a block (or circuit) 142, a block (or circuit) 144, a block (or circuit) 146, a block (or circuit) 148, a block (or circuit) 150, and a block (or circuit) 152. The circuit 142 may be implemented as a phase detector circuit. The circuit 144 may be implemented as a loop filter circuit. The circuit 146 may be implemented as a numerically controlled oscillator circuit (NCO). The circuit 148 may be implemented as a delay unit such as a register or register array. The circuit 150 may be implemented as a shifter or divider circuit. The circuit 152 may be implemented as another shifter or divider circuit.

The DPLL circuit 102 generally passes a phase from the NCO circuit 146 to the interpolation process performed by the interpolation circuit 104. The phase detector circuit 142 and the loop filter circuit 144 may operate at a fraction of the input sample clock rate. The NCO circuit 146 may operate at the input sample clock rate.

The phase detector circuit 142 generally measures a phase error between an oscillating signal generated by the NCO circuit 146 and the fixed period output sample clock OSC. To measure the phase error, the phase detector circuit 142 may measure a value of the signal A at positive edges of the divided output sample clock OSC. The phase detector circuit 142 may receive the input sample clock ISC, a divided version of the output sample clock (e.g., OSC/V, where V may be an integer such as 2) and a signal (e.g., A). The phase detector circuit 142 may generate a signal (e.g., B). The signal B may be an error signal conveying a phase error between the divided output sample clock OSC and the signal A. The signal A may transfer a periodic sequence of phase values. Each phase value may be represented as a multi-bit (e.g., 17-bit) number. The phase values in the oscillator signal A may be implemented as unsigned numbers. The phase error values in the phase error signal B may be implemented as signed numbers. The input sample clock ISC may provide control of when the phase error values are changed or updated in the phase error signal B.

The loop filter circuit 144 generally controls (i) a response time of a loop within the DPLL circuit 102 and (ii) a steady-state variance of the oscillating signal generated by the NCO circuit 146. The loop filter circuit 144 may receive the signal B and a divided version of the input sample clock (e.g., ISC/W, where W may be an integer such as 4). The loop filter circuit 144 may filter the signal B to generate a filtered signal (e.g., C). The signal C may also implement a phase error signal transferring a period sequence of filtered phase error values. Each filtered phase error value may be represented as a multi-bit (e.g., 30-bit signed) number. The divided input sample clock ISC/4 may provide control of when the filtered phase error values are changed or updated in the filtered phase error signal C.

The delay circuit 148 may delay the filtered phase error signal C to generate a delayed phase error signal (e.g., D). A duration of the delay may be determined by the divided input sample clock ISC/4. The delayed error signal D may be represented as a period sequence of multi-bit (e.g., 30-bit signed) phase error values.

The NCO circuit 146 may be implemented as an accumulator that computes a phase relationship between the input sample clock ISC and the output sample clock OSC. The NCO circuit 146 may generate an oscillating signal (e.g., E) based upon the delayed phase error signal D and the input sample clock ISC. The oscillator signal E may be represented as a sequence of amplitude values. Each amplitude value may be implemented as a multi-bit (e.g., 32-bit unsigned) number. A change rate of the amplitude values may be controlled by the input sample clock ISC. The oscillator signal E may produce a period signal having a variable cycle period or time. Changes to the variable cycle period may track changes in the period 92 of the input sample clock ISC. In one embodiment, the oscillator signal E may be implemented a sawtooth shaped waveform. Other waveforms may be implemented to meet the criteria of a particular application.

The shifter circuit 150 may shift the amplitude values in the oscillator signal E several bits (e.g., 15 bits) to generate the signal A. The signal A may therefore be a reduced amplitude oscillator signal. Discrete values within the signal A may be represented by as multi-bit (e.g., 17-bit unsigned) numbers.

The shifter circuit 152 may shift the amplitude values in the oscillator signal E by a few bits (e.g., 1 bit) to generate the intermediate signal INT. Therefore, the intermediate signal INT may implement a phase signal. The phase signal INT generally carries a periodic sequence of phase values. Each phase value may be implemented as a multi-bit (e.g., 31-bit unsigned) number. A change rate of the phase values may be governed by the input sample clock ISC.

Figure 7:
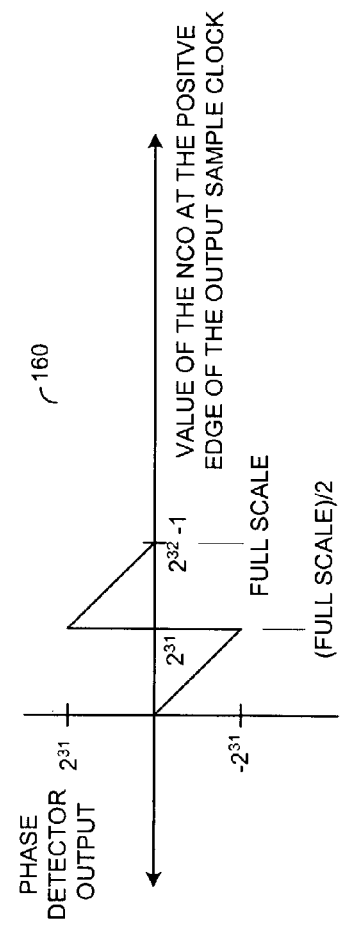
FIG. 7 is a diagram illustrating an example transfer function implemented within a phase detector circuit.

Referring to FIG. 7, a diagram illustrating an example transfer function 160 implemented within the phase detector circuit 142 is shown. The transfer function 160 generally relates an amplitude of the phase error signal B (shown along the y-axis) to the oscillator signal E (shown along the x-axis). If the amplitude value of the oscillator signal E is less than or equal to half a full scale value (where the maximum full scale value may be $2^{32}-1$), the transfer function 160 may generate the phase error signal B with an amplitude equal to a negative of the amplitude of the reduced oscillator signal A. The y-axis ranges from $2^{16}-1$ to $-2^{16}$ per the 17-bit signal B. If the value of the oscillator output signal A is greater than half of the full scale value, the transfer function 160 may generate the phase error signal B with an amplitude equal to the full scale value minus the amplitude value of the reduced oscillator signal A.

Figure 8:
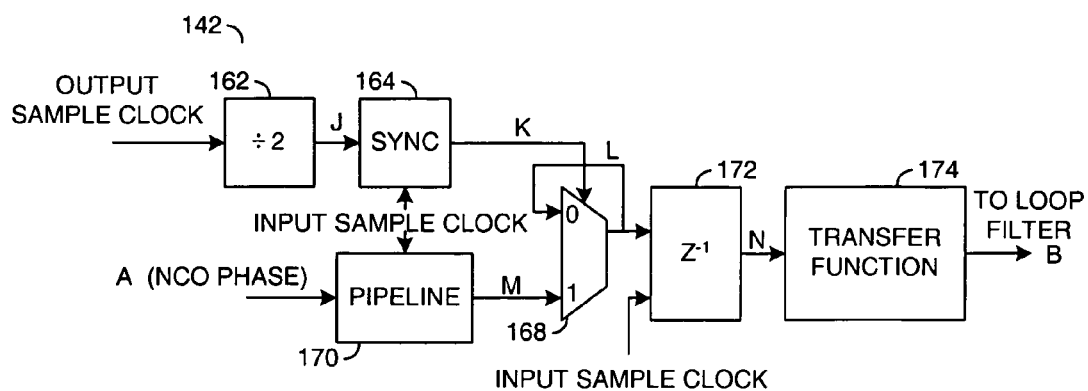
FIG. 8 is a block diagram of an example circuit implementing a phase detector circuit.
Figure 2:
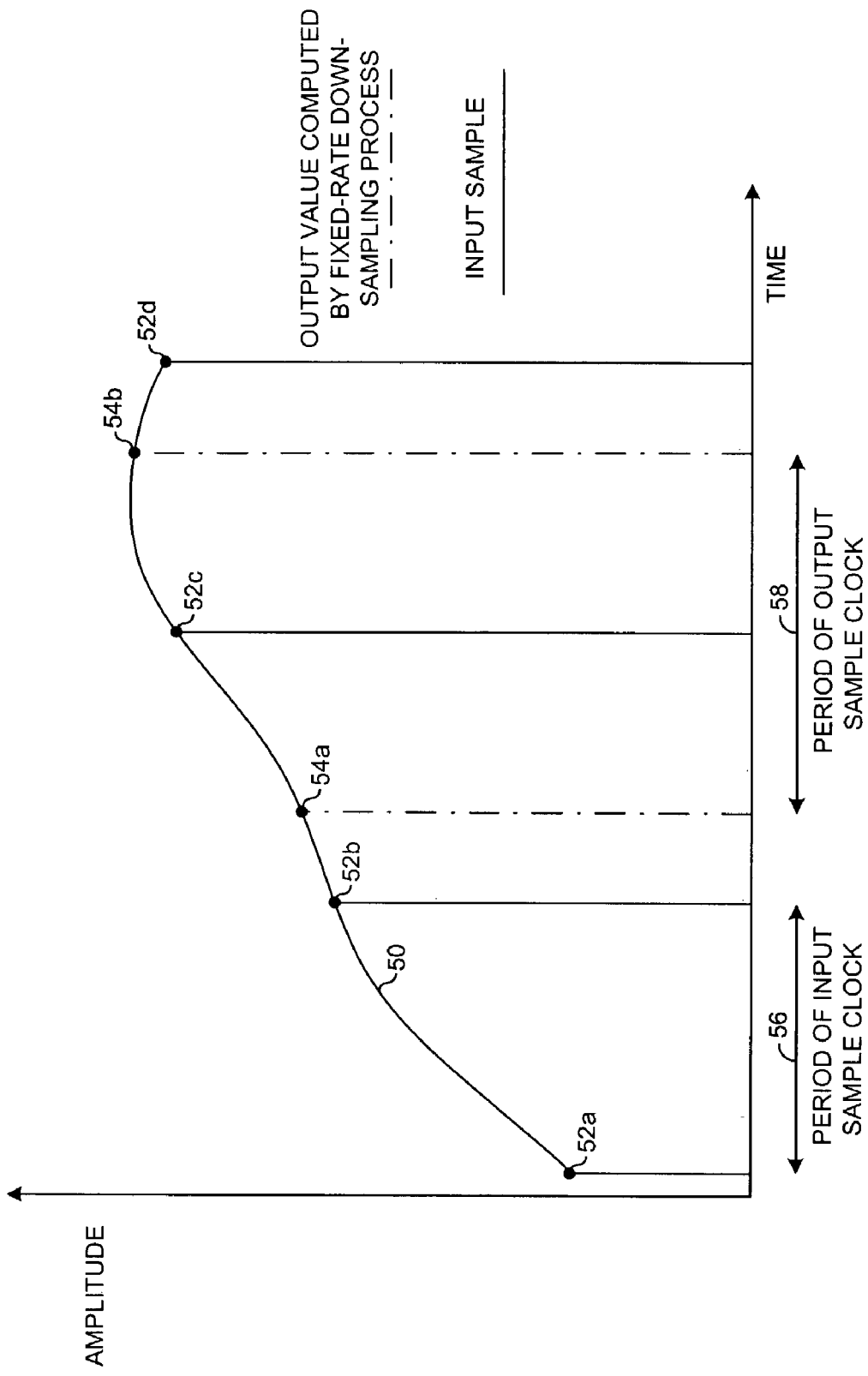
FIG. 2 is a diagram illustrating an example of time response with fixed down sampling of the circuit of FIG. 1.
Figure 3:
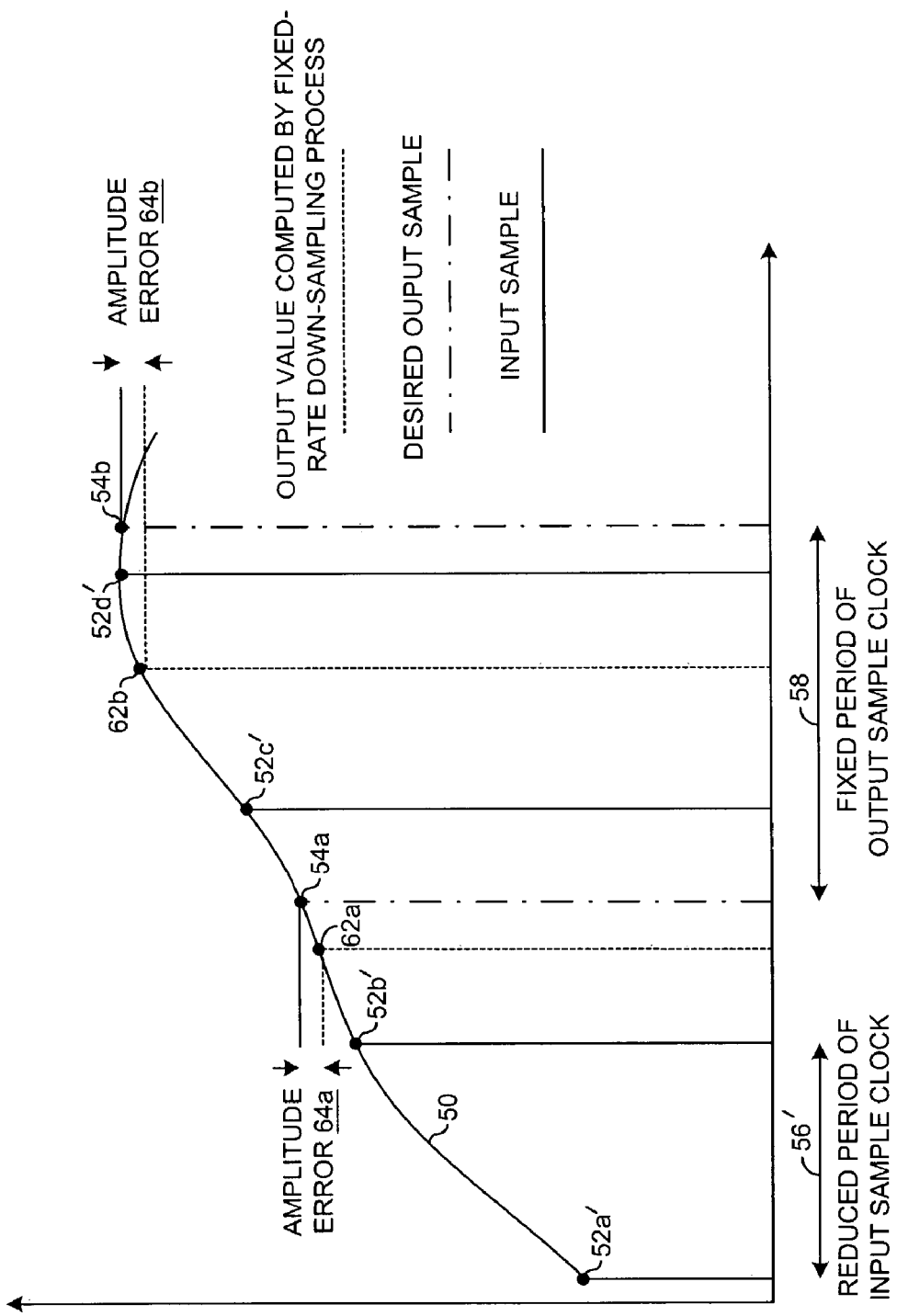
FIG. 3 is a diagram illustrating an example of time response amplitude error with fixed down sampling of the circuit of FIG. 1.

Referring to FIG. 8, a block diagram of an example circuit implementing the phase detector circuit 142 is shown. The phase detector circuit 142 generally uses a reduced output sample clock (e.g., OSC/V, where V may be an integer such as 2) so that there may be a sufficient number of input sample clock ISC periods 92 to perform a proper synchronization of the output sample clock OSC into the input sample clock ISC domain. Therefore, the NCO circuit 146 may operate at the input sample clock ISC rate and the oscillator signal E may roll over at the reduced output sample clock rate OSC/2.

The phase detector circuit 142 generally comprises a block (or circuit) 162, a block (or circuit) 164, a block (or circuit) 168, a block (or circuit) 170, a block (or circuit) 172 and a block (or circuit) 174. The circuit 162 may be implemented as a divider circuit. The divider circuit 172 may divide the output sample clock OSC by a predetermined integer (e.g., 2) to produce a clock (e.g., J).

The circuit 164 may be implemented as a synchronizer circuit. The synchronizer circuit 164 may synchronize the clock J with the input sample clock ISC to generate another clock (e.g., K).

The circuit 168 may be implemented as a multiplexer circuit. The multiplexer circuit 168 may receive the clock K as an address to route one of multiple inputs to an output. A signal (e.g., L) at the output of the multiplexer circuit 168 may be feed back to a first input (e.g., input 0) of the multiplexer circuit 168. A second input (e.g., input 1) of the multiplexer circuit 168 may receive another signal (e.g., M).

The circuit 170 may be implemented as a pipeline delay circuit. The pipeline delay circuit 170 may generate the signal M by delaying the reduced oscillator signal A. The pipeline delay circuit 170 may be used to match a delay of the output sample clock OSC through the divider circuit 162 and the synchronization circuit 164. The pipeline delay circuit 170 may receive the input sample clock ISC for control of the delay time.

The circuit 172 may be a register implementing a delay unit. The register 172 may store the signal L on rising (or falling) edges of the input sample clock ISC. An output of the register 172 may present the stored value as another signal (e.g., N).

The circuit 174 may be implemented as a transfer circuit. The transfer circuit 174 may implement a transfer function such as the transfer function 160 shown in FIG. 7. Other transfer functions may be implemented to meet the criteria of a particular application. The transfer circuit 174 may operate on the signal N to produce the phase error signal B.

Figure 9:
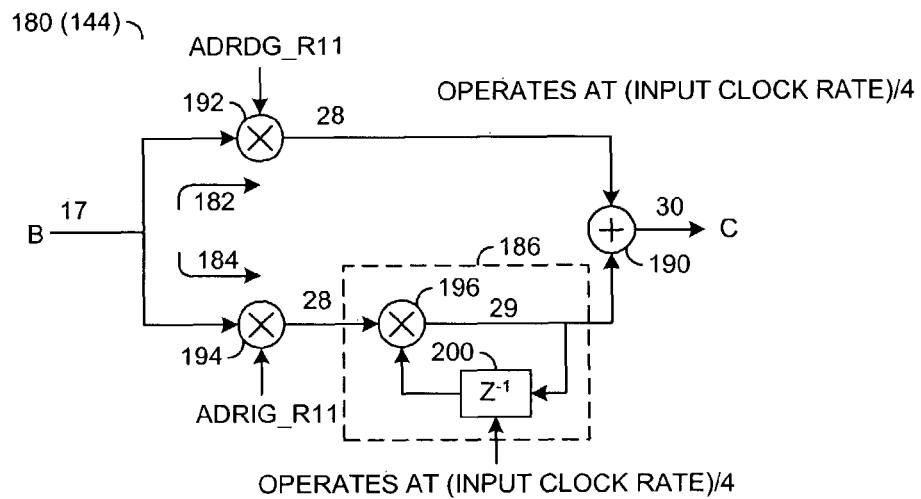
FIG. 9 is a block diagram of an example architecture for a loop filter circuit.

Referring to FIG. 9, a block diagram of an example architecture for the loop filter circuit 144 is shown. A loop filter model 180 is generally implemented with a proportional path 182 and an integral path 184. As the DPLL circuit 102 achieves a lock between the oscillator signal E and the output sample clock OSC, the proportional path 182 generally approaches a zero value and an integrator 186 in the integral path 184 may reach a nominal frequency of the oscillator signal E and a frequency of the output sample clock OSC.

The loop filter model 180 generally comprises a summation 190, a multiplier 192, a multiplier 194 and the integrator 186. The summation 190 may add the values in the proportional path 182 and the integral path 184. The multiplier 192 may provide a gain for the proportional path. A predetermined value (e.g., ADRDG_R11) may be received by the multiplier 192 to set the proportional path gain. The multiplier 194 may provide a gain for the integral path 184. A predetermined value (e.g., ADRIG_R11) may be received by the multiplier 194 to set the integral path gain.

The integrator 186 generally comprises a multiplier 196 and a delay unit 200. The delay unit 200 may receive the divided input sample clock ISC/4 to control the delay time.

Figure 10:
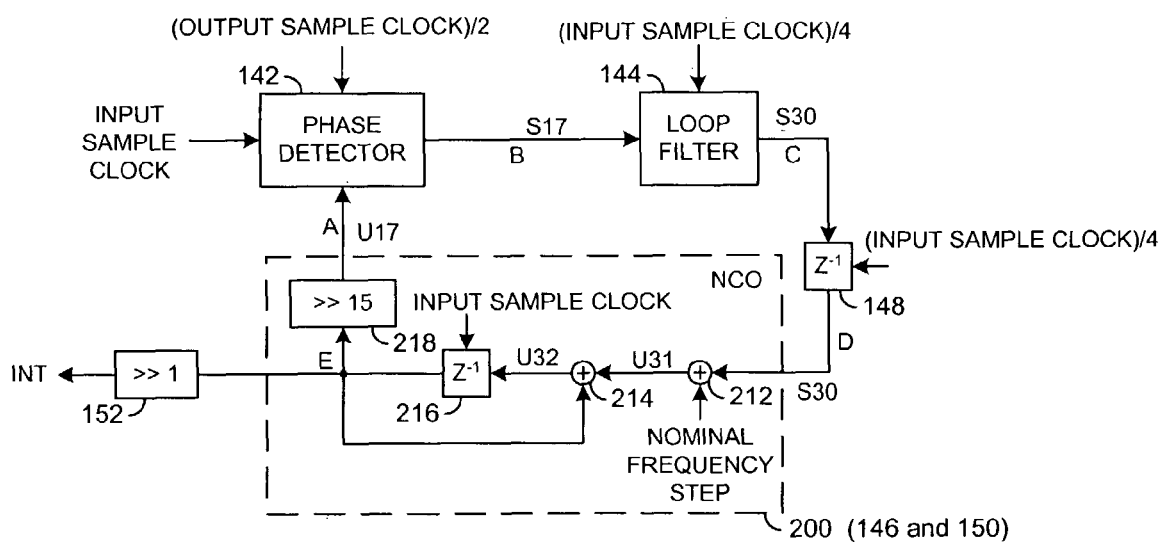
FIG. 10 is a block diagram of an example architecture for a numerically controlled oscillator circuit and a delay circuit.

Referring to FIG. 10, a block diagram of an example architecture for the numerically controlled oscillator circuit 146 and the delay circuit 150 is shown. A model 210 for the NCO circuit 146 and the delay circuit 150 generally comprises a summation 212, a summation 214, a delay unit 216 and a shift operation 218.

A nominal frequency step signal generally controls a nominal frequency of the NCO circuit 146 at the summation 212. The summation 214 and delay unit 216 may be arranged to generate the oscillator signal E. The shift operation 218 may model the operation of the shift circuit 150.

The loop filter circuit 144 and delay circuit 148 may update the phase and frequency of the oscillator signal E. Once the DPLL circuit 102 locks, the phase and frequency of the oscillator signal E generally tracks the phase and frequency of the output sample clock OSC, respectively.

Since the oscillator signal E generally rolls over (e.g., rapidly transitions from a high value to a low value) at half the output sample clock OSC rate, a portion (e.g., the lower 31 bits) of the oscillator signal E may be applied to the interpolation circuit 104. The second most significant bit (MSB) of the oscillator signal E may roll over at twice the roll over rate of the oscillator signal E. Therefore, the second MSB of the oscillator signal E may be used as the MSB of the signal INT provided to the interpolation process.

Figure 11:
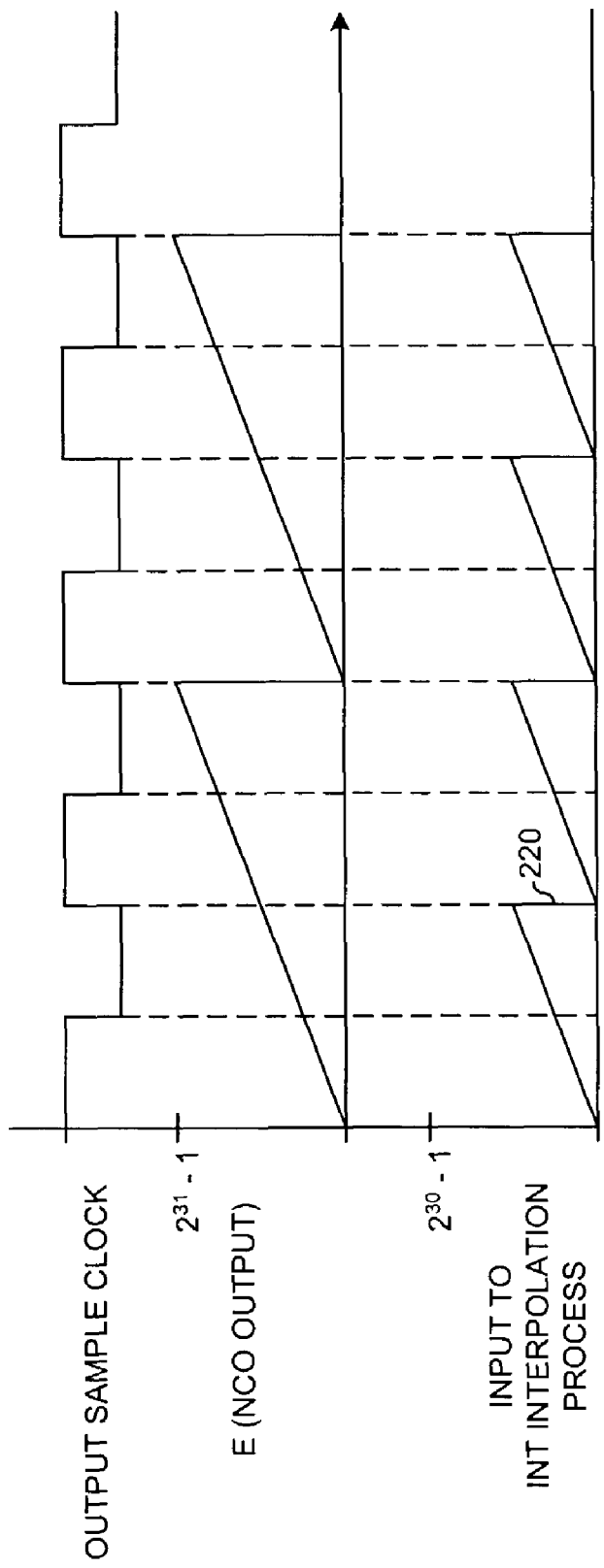
FIG. 11 is a timing diagram of example waveforms for an oscillator signal and an intermediate signal relative to an output sample clock.

Referring to FIG. 11, a timing diagram of example waveforms for the oscillator signal E and the intermediate signal INT relative to the output sample clock OSC are shown. The output sample clock OSC and the intermediate signal INT generally show a one cycle-to-one cycle relationship. The intermediate signal INT and the oscillator signal E generally show a two cycle-to-one cycle relationship.

The intermediate signal INT may begin at a low value (e.g., zero) at each rising edge of the output sample clock OSC. During each cycle, the phase value of the intermediate signal INT may ramp up in a linear fashion to a high (e.g., approximately half full scale) value by the end of the present cycle. A roll over 220 of the intermediate signal INT may take place proximate each subsequent rising edge of the output sample clock OSC.

The interpolation process performed by the interpolation circuit 104 generally estimates the values of the output samples that change on the positive edge of the output sample clock OSC. A formula to calculate the output samples may be provided in equation 1 as follows:

$$y(n) = x(n-1) + [x(n) - x(n-1)] \frac{(\text{Full\_Scale} - NCO(n-1))}{NCO(n) + \text{Full\_Scale} - NCO(n-1)} \quad \text{Eq. (1)}$$

The variable x(n) may represent an input sample value sampled at the input sample clock ISC rate. The variable y(n) may represent a new sample computed by the interpolation process. The variable NCO(n) may represent a phase value within the intermediate signal INT taken at an input sample clock ISC edge n. The constant Full_Scale may represent a maximum value of the intermediate signal INT.

The variable NCO may divide each cycle of the output sample clock OSC into multiple time slices. Each time slice may be identified by the phase values presented by the variable NCO (e.g., the phase values in the intermediate signal INT). Therefore, any particular NCO value may indicate an instantaneous phase position in a clock cycle. The phase values or positions may be used by the interpolation process in determining when to calculate the sample values for the second intermediate signal INT2.

Figure 12:
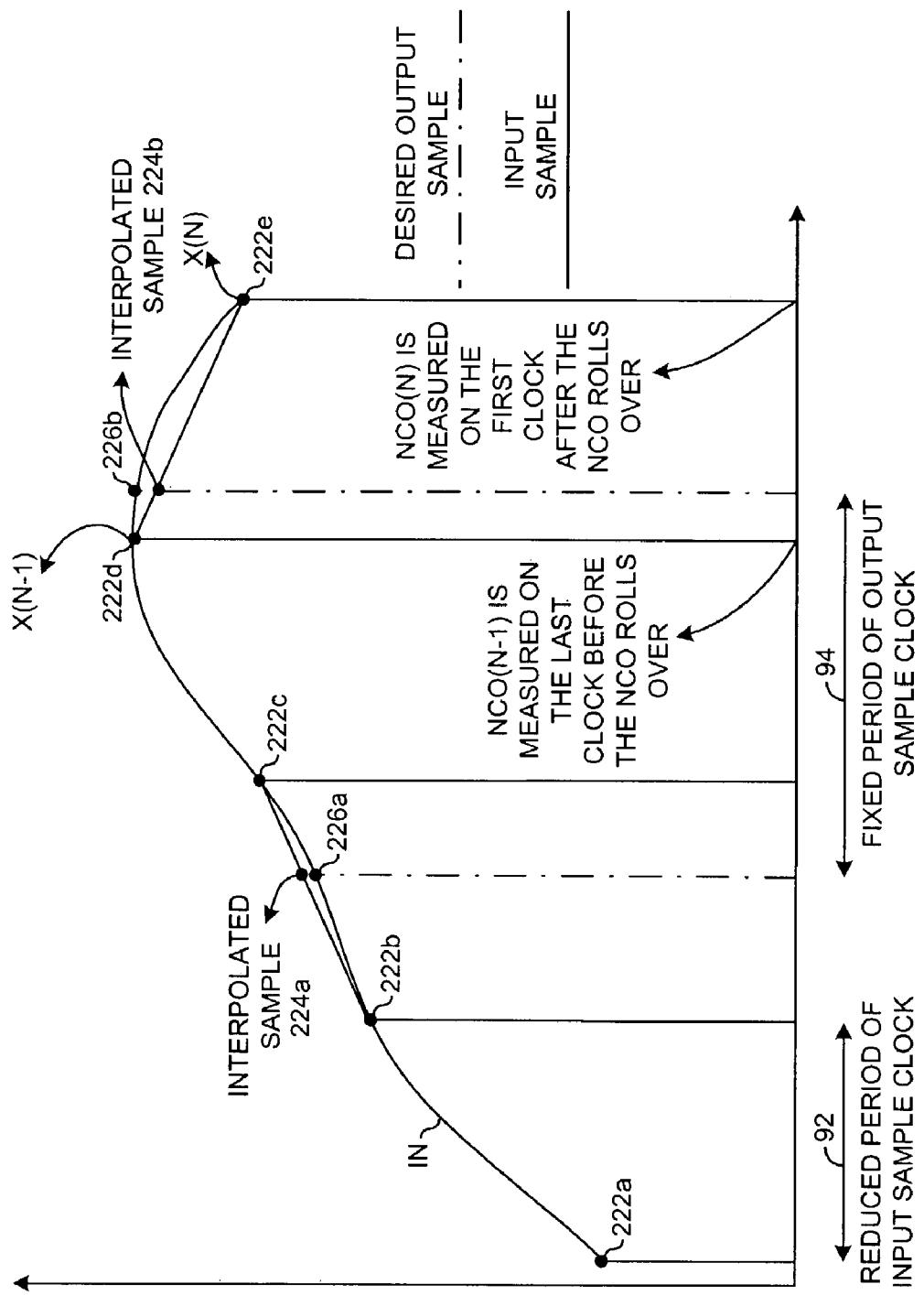
FIG. 12 is a diagram illustrating a linear interpolation.

Referring to FIG. 12, a diagram illustrating a linear interpolation is shown. A continuous waveform or the input data sequence IN may be sampled at the input sample clock ISC period 92 to generate a sequence of sample values 222a-222e. Interpolated samples 224a-224b may be computed as a function of the input samples 222 measured just before and just after a particular edge of the output sample clock OSC as identified by a roll over in the intermediate signal INT. Each roll over generally indicates a time of a positive edge in the output sample clock OSC. Once the interpolation process computes an estimated sample, the sample circuit 106 may sample the estimated value at the fixed output sample clock OSC period 94 to form the output data sequence OUT.

The adaptive data rate conversion shown generally computes the interpolated samples 224 by linearly interpolating between two consecutive samples 222. The fractional term generated by in right-hand side of equation 1 may determine a phase or time percentage between the consecutive samples 222 to calculate the interpolated samples 224. When the fraction is small, the interpolation may occur close to the prior sample n−1. When the fraction is large, the interpolation may occur close to the current sample n. Since the intermediate signal INT is quantized in time, the interpolations may occur proximate to simultaneous with the positive edges of the output sample clock OSC.

The actual values 226a and 226b of the input data sequence IN at the interpolation points may be slightly different (e.g., larger or smaller) than the interpolated values 224a and 224b, respectively. Therefore, the adaptive data rate conversion process and apparatus of the present invention may apply higher-order interpolation filters. The higher-order interpolation filters may reduce the error between the interpolated samples 224 and the actual values 226 of the input data sequence IN at the output sample clock OSC edges. For example, an interpolation method may consider two input samples before and two input samples after a particular interpolation time in calculating the interpolated value. Other applications may include techniques to reduce data rate jitter by using changes in the input data rate to one or more filter coefficients to provide a stable data rate on the filter output that would be resampled at a mean frequency of the time varying input data rate.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
   a first circuit configured to generate a phase signal having a sequence of phase values that form an oscillating waveform, wherein said phase values (i) have a change rate that matches a frequency of an input clock and (ii) convey a plurality of respective phase positions in each cycle of an output clock;
   a second circuit configured to (i) generate a sampled data signal by sampling an input data signal with said input clock and (ii) generate an intermediate data signal by interpolating said sampled data signal in response to respective pairs of said phase values, wherein said input data signal comprises an analog signal; and
   a third circuit configured to generate an output data signal by sampling said intermediate data signal with said output clock, wherein said first circuit comprises a phase detector configured to generate an error signal by detecting a phase error between said output clock and said phase signal.

2. The apparatus according to claim 1, wherein said first circuit further comprises an oscillator configured to generate said phase signal in response to said error signal, wherein said phase signal comprises a digital signal.

3. The apparatus according to claim 1, wherein said phase detector comprises:
   a synchronizer configured to generate an intermediate clock in response to said input clock and said output clock.

4. The apparatus according to claim 3, wherein said phase detector further comprises:
   a pipeline circuit configured to delay said phase signal into alignment with said intermediate clock.

5. The apparatus according to claim 1, wherein said first circuit further comprises:
   a transfer circuit configured to generate said error signal in a range between a positive value and a negative value.

6. The apparatus according to claim 1, wherein said second circuit generates said intermediate data signal in further response to a first value of said input data signal at a first edge of said input clock before a predetermined edge of said output clock.

7. The apparatus according to claim 6, wherein said second circuit generates said intermediate data signal in further response to a second value of said input data signal at a second edge of said input clock after said predetermined edge of said output clock.

8. The apparatus according to claim 7, wherein said second circuit generates said intermediate data signal by linearly interpolating between said first value and said second value of said input data signal proximate said predetermined edge of said output clock.

9. The apparatus according to claim 1, wherein said input clock has a variable cycle period.

10. A method for operating an apparatus, comprising the steps of:
    (A) generating a phase signal having a sequence of phase values that form an oscillating waveform, wherein said phase values (i) have a change rate that matches a frequency of an input clock and (ii) convey a plurality of respective phase positions in each cycle of an output clock;
    (B) generating a sampled data signal by sampling an input data signal with said input clock, wherein said input data signal comprises an analog signal;
    (C) generating an intermediate data signal by interpolating said sampled data signal in response to respective pairs of said phase values; and
    (D) generating an output data signal by sampling said intermediate data signal with said output clock, wherein generating said phase signal comprises the sub-step of generating an error signal by detecting a phase error between said output clock and said phase signal.

11. The method according to claim 10, wherein step (A) further comprises the sub-step of:
    adjusting said phase values to roll over between a high value and a low value proximate an edge of said output clock in response to said error signal.

12. The method according to claim 10, wherein step (A) further comprises the sub-step of:
    changing said error signal over time in response to said frequency of said input clock.

13. The method according to claim 10, wherein generating said error signal is in response to a transfer function such that said error signal ranges between a positive value and a negative value.

14. The method according to claim 10, wherein step (C) comprising the sub-step of:
    determining a first of said phase values proximate a first edge of said input clock before a predetermined edge of said output clock.

15. The method according to claim 14, wherein step (C) further comprises the sub-step of:
    determining a second of said phase values proximate a second edge of said input clock after said predetermined edge of said output clock.

16. The method according to claim 14, wherein step (C) further comprises the sub-step of:
    calculating a value for said intermediate signal at said predetermined edge in response to said first value and said second value.

17. The method according to claim 10, wherein step (A) further comprises the sub-step of:

changing said phase signal over time in response to said frequency of said input clock.

18. A circuit comprising:

means for generating a phase signal having a sequence of phase values that form an oscillating waveform, wherein said phase values (i) have a change rate that matches a frequency of an input clock and (ii) convey a plurality of respective phase positions in each cycle of an output clock;

means for (i) generating a sampled data signal by sampling an input data signal with said input clock and (ii) generating an intermediate data signal by interpolating said sampled data signal in response to respective pairs of said phase values, wherein said input data signal comprises an analog signal; and means for generating an output data signal by sampling said intermediate data signal with said output clock, wherein said means for generating said phase signal comprises means for generating an error signal by detecting a phase error between said output clock and said phase signal.

* * * * *